United States Patent
Kim et al.

(10) Patent No.: US 9,310,655 B2
(45) Date of Patent: Apr. 12, 2016

(54) APPARATUS FOR FABRICATING A FLAT PANEL DISPLAY DEVICE AND METHOD THEREOF

(75) Inventors: Yong-Il Kim, Chungcheongnam-do (KR); Jung-Ho Bang, Paju-si (KR); Gi-Sang Hong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1172 days.

(21) Appl. No.: 13/292,901

(22) Filed: Nov. 9, 2011

(65) Prior Publication Data
US 2012/0122366 A1    May 17, 2012

(30) Foreign Application Priority Data

Nov. 12, 2010 (KR) .................. 10-2010-0112694

(51) Int. Cl.
| | | |
|---|---|---|
| H01J 9/02 | (2006.01) | |
| H01J 9/46 | (2006.01) | |
| G02F 1/1343 | (2006.01) | |
| H01L 21/67 | (2006.01) | |

(52) U.S. Cl.
CPC ...... *G02F 1/13439* (2013.01); *H01L 21/67173* (2013.01); *H01L 21/67213* (2013.01)

(58) Field of Classification Search
None
See application file for complete search history.

(56) References Cited

U.S. PATENT DOCUMENTS

| | | | |
|---|---|---|---|
| 6,225,969 B1 * | 5/2001 | Ishii | ................. 345/100 |
| 6,955,578 B2 | 10/2005 | Park et al. | |
| 2001/0030717 A1 | 10/2001 | Kaneko et al. | |
| 2004/0150778 A1 | 8/2004 | Izumi et al. | |
| 2009/0242887 A1 * | 10/2009 | Yamamoto et al. | ....... 257/59 |

FOREIGN PATENT DOCUMENTS

| | | |
|---|---|---|
| CN | 1423344 A | 6/2003 |
| CN | 1746329 A | 3/2006 |
| JP | 2009-267222 A | 11/2009 |
| KR | 10-2001-0104428 A | 11/2001 |
| KR | 10-2003-0086934 A | 11/2003 |

* cited by examiner

*Primary Examiner* — Dah-Wei D Yuan
*Assistant Examiner* — Jethro M Pence
(74) *Attorney, Agent, or Firm* — Birch, Stewart, Kolasch & Birch, LLP (57) ABSTRACT

An apparatus and method for fabricating a flat panel display device are discussed. According to an embodiment, the apparatus includes a coating line configured to form a transparent conductive metal layer on a substrate, a blackening line configured to blacken the transparent conductive metal layer, an exposure line configured to expose the blackened metal layer, a developing line configured to receive the exposed substrate having the blackened metal layer and to perform development on the received substrate to form a blackened metal pattern on the substrate, and an annealing line configured to perform annealing on the blackened metal pattern on the substrate to restore the blackened metal pattern to a transparent metal pattern.

14 Claims, 6 Drawing Sheets

APPARATUS FOR FABRICATING A FLAT PANEL DISPLAY DEVICE AND METHOD THEREOF

This application claims the priority benefit of the Korean Patent Application No. 10-2010-0112694, filed on Nov. 12, 2010, which is hereby incorporated by reference as if fully set forth herein.

BACKGROUND OF THE INVENTION

1. Field of the Invention

The present invention relates to an apparatus for fabricating a flat panel display device, and more particularly, to an apparatus for fabricating a flat panel display device and method thereof. Although the present invention is suitable for a wide scope of applications, it is particularly suitable for forming a transparent thin film or pattern with precise thickness and width by reducing a defective rate in the course of fabricating the flat panel display device.

2. Discussion of the Related Art

Recently, light and thin flat panel displays are mainly used as image displays for personal computers, mobile terminals, monitors of various information devices and the like. This flat panel display may include one of a liquid crystal display (LCD), a light emitting display, a plasma display panel, a field emission display and the like.

In particular, an organic field light emitting device is mainly used as the light emitting display. In this case, the organic field light emitting device consists of a $1^{st}$ electrode, a $2^{nd}$ electrode and an organic thin film layer between the $1^{st}$ and $2^{nd}$ electrodes. This light emitting display displays an image by controlling a light emission quantity of the organic light emitting devices.

In case of the liquid crystal display, a liquid crystal display panel consisting of a pair of substrates attached together with a predetermined space in-between and a liquid crystal layer injected between the pair of the substrates. In this case, a plurality of pixel regions are defined as a matrix type by gate lines and data lines. By adjusting a light transmissive rate through each of the pixel regions, an image may be displayed.

In order to fabricate the above-mentioned flat panel display devices, it is necessary to form metal thin films, which include various patterns, electrodes and the like, on at least one substrate. In particular, the various patterns, electrode, metal films and the like are formed by photolithography.

The photolithography consists of the processes for cleaning a substrate, forming a photoresist or various conductive metal layers on the cleaned substrate, exposing the photoresist or the conductive metal layer using a photo mask, developing the exposed photoresist or metal layer and the like.

However, according to the related art photolithography, it is difficult to adjust an exposure quantity in forming a transparent electrode or film having a high light transmissive rate. For instance, when a thin film or pattern is formed of such a transparent conductive metal as ITO (indium tin oxide), IZO (indium zinc oxide), AXO (Al-doped zinc oxide) and the like, a light applied to the substrate passes through the transparent metal layer and the substrate, reflects from an exposure device, and is then applied back to the substrate and the transparent metal layer. Therefore, it is difficult to control the exposure quantity. Thus, according to the related art, a limitation is put on precisely fabricating a transparent pattern or electrode by reducing a thickness or width of the transparent pattern or electrode. And, the related art photolithography has a high defective rate and a lower process efficiency.

SUMMARY OF THE INVENTION

Accordingly, the present invention is directed to an apparatus for fabricating a flat panel display device and method thereof that substantially obviate one or more problems due to limitations and disadvantages of the related art.

An object of the present invention is to provide an apparatus for fabricating a flat panel display device and method thereof, by which a defective rate in forming a transparent thin film or pattern may be lowered with a more precise thickness and width in the course of fabricating the flat panel display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for fabricating a flat panel display device may include a loading/unloading unit configured to move a substrate to or from an external source, a coating line configured to form a transparent conductive metal layer on the substrate, a blackening line configured to blacken the transparent conductive metal layer, an exposure line configured to expose the blackened metal layer, a developing line configured to receive the substrate having the blackened metal layer and perform development on the received substrate, and an annealing line configured to restore a transparency of the metal layer by annealing the blackened metal layer.

Preferably, the blackening line may blacken the transparent conductive metal layer or lower the transparency of the conductive metal layer by performing a hydrogen plasma processing on the transparent conductive metal layer using a plasma chemical vapor deposition or a plasma source.

More preferably, the exposure line may align a photo mask corresponding to a desired pattern on the blackened metal layer having a light transmissivity lowered by the blackening process, and may apply UV rays to the entire surface of the substrate including the photo mask.

In this case, the annealing line may harden the substrate, on which patterns of the blackened metal layer are formed, at the temperature of, e.g., 20 to 150 Celsius degrees using a hard-bake hot plate to restore the transparency of the metal layer from the blackened metal layer. As a variation, the temperature used at the annealing process can be 100 to 400 Celsius degrees.

Preferably, the apparatus may further include a cleaning line configured to clean the substrate from the loading/unloading unit and to supply the cleaned substrate to the coating line, a titling line configured to form an identification code on the substrate exposed by the exposure line and to supply the corresponding substrate to the developing line, a conveying line configured to convey the substrate having the blackened metal layer to the exposure line and to convey the exposed substrate to the titling line, and at least one transfer loader unit provided movable between at least two of the cleaning line, the coating line, the titling line, the developing line and the annealing line to transfer the substrate to each of the fabricating lines.

In another aspect of the present invention, a method of fabricating a flat panel display device may include the steps of loading/unloading a substrate to or from an external device, forming a transparent conductive metal layer on the substrate, blackening the transparent conductive metal layer, exposing the blackened metal layer, performing development on the blackened metal layer received, and restoring the transparency of the blackened metal layer from the blackened metal layer by annealing the blackened metal layer.

Preferably, the blackening step may include the step of blackening the transparent conductive metal layer by performing a hydrogen plasma processing on the substrate having the transparent conductive metal layer by a plasma chemical vapor deposition or a plasma source.

More preferably, the exposing step may include the steps of aligning a photo mask corresponding to a desired pattern on the blackened metal layer having a light transmissivity lowered by the blackening, and applying UV rays to the entire surface of the substrate including the photo mask.

In this case, the annealing step may include the step of hardening the substrate, on which patterns of the blackened metal layer are formed, at the temperature of 20 to 150 Celsius degrees, or 100 to 400 Celsius degrees, using a hard-bake hot plate to restore the transparency of the metal layer from the blackened metal.

Preferably, the method may further include the steps of cleaning the substrate from the loading/unloading unit, forming an identification code on the substrate exposed by the exposure line, conveying the substrate having the blackened metal layer to the exposure step or conveying the exposed substrate to the titling step, and transferring the substrate to each of the steps using at least one transfer loader unit provided movable between at least two of the cleaning step, the coating step, the identification code forming step, the developing step and the annealing step.

According to an embodiment, the invention provides an apparatus for fabricating layers of a display device, comprising: a coating line configured to form a transparent conductive metal layer on a substrate; a blackening line configured to blacken the transparent conductive metal layer; an exposure line configured to expose the blackened metal layer; a developing line configured to receive the exposed substrate having the blackened metal layer and to perform development on the received substrate to form a blackened metal pattern on the substrate; and an annealing line configured to perform annealing on the blackened metal pattern on the substrate to restore the blackened metal pattern to a transparent metal pattern.

According to an embodiment, the invention provides an apparatus for forming a layer pattern of a display device, comprising: a first line configured to form a transparent conductive metal layer on a substrate; a second line configured to temporarily change a transparency of the metal layer by changing the transparent conductive metal layer into a less-transparent conductive metal layer; a third line configured to perform exposure and development on the substrate having the less-transparent conductive metal layer so as to pattern the less-transparent conductive metal layer; and a fourth line configured to perform annealing on the patterned less-transparent conductive metal layer so as to change the less-transparent conductive metal layer back to the transparent conductive metal layer.

According to an embodiment, the invention provides an method for forming a layer pattern of a display device, the method comprising: forming a transparent conductive metal layer on a substrate; temporarily changing a transparency of the metal layer by changing the transparent conductive metal layer into a less-transparent conductive metal layer; performing exposure and development on the substrate having the less-transparent conductive metal layer so as to pattern the less-transparent conductive metal layer; and performing annealing on the patterned less-transparent conductive metal layer so as to change the less-transparent conductive metal layer back to the transparent conductive metal layer.

Accordingly, the present invention may provide the following effects and/or advantages.

First of all, according to the present invention, when a transparent thin film or pattern is formed in the course of fabricating a flat panel display device, blackening is performed on a transparent conductive metal layer and an exposure process is then performed. Therefore, the present invention enables the transparent thin film or pattern to be formed with a more precise thickness and width and also lowers a corresponding defective rate, thereby enhancing the fabrication efficiency of the flat panel display device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

An apparatus for fabricating a flat panel display device and method thereof according to an embodiment of the present invention may be described with reference to the accompanying drawings as follows.

First of all, in order to fabricate various flat panel display devices, various patterns, thin films, electrodes and the like need to be formed non-transparent or transparent on at least one substrate. In particular, these patterns, thin films, electrodes and the like may be formed by photolithography, etching, stripping and the like.

Various patterns, thin films, electrodes and the like, which are formed transparent, of the present invention may be formed by a step of blackening a transparent conductive metal layer, a step of exposing the blackened transparent conductive metal layer, a step of developing the exposed transparent conductive layer, an annealing step of recovering a transparent metal layer patterned after the developing step, and the like.

Figure 1:
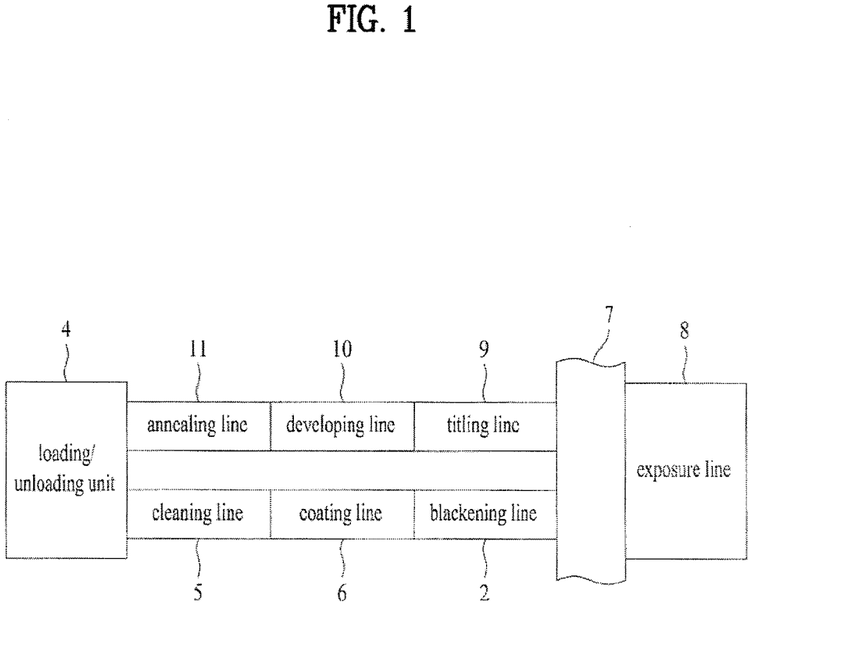
FIG. 1 is a block diagram for a layout structure in a method of fabricating a flat panel display device according to an embodiment of the present invention.

More specifically, FIG. 1 is a block diagram for a layout structure in a method of fabricating a flat panel display device according to an embodiment of the present invention.

Referring to FIG. 1, an apparatus for fabricating a flat panel display device such as a liquid display panel, a light emitting panel, etc. may include a loading/unloading unit 4 configured to load/unload a substrate externally, a cleaning line 5 configured to clean the loaded substrate, a coating line 6 configured to form a transparent conductive metal layer on the cleaned substrate, a blackening line 2 configured to blacken the transparent conductive metal layer on the cleaned substrate, an exposure line 8 configured to expose the blackened metal layer on the substrate, a titling line 9 configured to form an identification code on the exposed substrate, a conveying line 7 configured to convey the blackened metal layer formed substrate from the blackening line 2 to the exposure line 8 and to convey the exposed substrate from the exposure line 8 to the titling line 9, a developing line 10 configured to perform development on the substrate provided from the titling line 9, and an annealing line 11 configured to recover a blackened metal pattern patterned by the development into a transparent metal pattern by annealing.

Moreover, the apparatus for fabricating the flat panel display device according to the present invention may further include at least one transfer loader unit provided movable between at least two of the cleaning line 5, the coating line 6, the titling line 9, the developing line 10 and the annealing line 11 to transfer the substrate to each of the fabricating lines.

The loading/unloading unit 4 withdraws a substrate from a cassette conveyed by an external conveyer and then loads the withdrawn substrate onto the cleaning line 5. The loading/unloading unit 4 may transfer a substrate from the annealing line 11 to a cassette. And, the loading/unloading unit 4 may include at least robot arm configured to load/unload the substrate. As a variation, multiple substrates may be processed and conveyed through the lines of the apparatus, simultaneously.

Meanwhile, the loading/unloading unit 4 may be installed in a manner of being separated into a loading unit having a robot arm for loading a substrate onto the cleaning line 5 and an unloading unit having a robot arm for withdrawing a transparent metal pattern formed substrate from the annealing line 11 and then unloading the withdrawn substrate externally to an external device. If the loading/unloading unit 4 is installed as being separated into the loading unit and the unloading unit, it may be able to reduce a loading/unloading TACT time.

The cleaning line 5 may clean one or more substrates provided by the loading/unloading unit 4 via the transfer loader unit and the like and may enable the cleaned substrate(s) to be transferred to the coating line 6. One or more cleaned substrates may be transferred to the coating line 6 simultaneously. In particular, the cleaning line 5 may include a cleaning conveyer configured to convey the substrate toward the coating line 6 and at least one cleaning unit configured to clean the substrate conveyed by the cleaning conveyer by spraying a cleaning liquid on the conveyed substrate. In this case, when a liquid crystal display device fabricated, the substrate may include a substrate on which gate and data lines are formed, and more particularly, a lower substrate on which a conductive metal pattern, a thin film and the like are formed. In another example, when a light emitting display device is fabricated, the substrate may include a substrate on which an organic thin film, a transparent anode, a transparent cathode and the like are formed.

The coating line 6 is provided with the cleaned substrate(s) from the cleaning line 5 and then forms a transparent conductive metal layer to a preset thickness. In doing so, the coating line 6 evenly coats the entire surface of the cleaned substrate with a transparent conductive metal layer by a deposition such as PECVD (plasma enhanced chemical vapor deposition), other types of plasma deposition, sputtering or the like. As a variation, instead of using the plasma deposition techniques, other types of processes such as a plasma source can be used to form the transparent conductive metal layer on the substrate.

The blackening line 2 may blacken the transparent conductive metal layer by performing a plasma enhanced chemical vapor deposition (or other types such as a plasma source) on the substrate having the transparent conductive metal layer formed thereon. For instance, in case that the transparent conductive metal layer is formed of ITO (indium tin oxide), IZO (indium zinc oxide) or the like on the substrate, the blackening effect may occur in a manner that indium (In) precipitates by non-stoichiometry attributed to oxygen deficiency in hydrogen plasma processing. Hence, when the transparent conductive metal layer is blackened, it changes to being non-transparent or less transparent due to a processing condition and equipment configuration to lower a light transmissivity of the metal layer on the substrate. According to the invention, although it may be desirable to blacken the transparent conductive metal layer as much as possible to maximize the accuracy of the patterning performed in the exposure line 8, this needs to be balanced since the blackened metal layer needs to be restored to the transparent metal layer at the annealing line 11.

Then the substrate having the metal layer is moved from the blackening line 2 to the exposure line via the conveying line 7. The exposure line 8 aligns a photo mask corresponding to a desired pattern on the metal layer having the lowered light transmissivity due to the blackening, and then executes an exposure process by applying UV rays to the entire surface of the substrate including the photo mask. For this, the exposure line 8 may include a temperature control unit configured to maintain a temperature of the blackened metal layer formed substrate (i.e., the substrate having the blackened metal layer formed thereon) at a temperature suitable for the exposure process, and at least one exposure unit configured to expose the blackened metal layer formed substrate.

The titling line 9 receives the substrate (having the blackened metal layer thereon) from the exposure line 8 via the conveying line 7. The tilting line 9 may include a conveyer configured to conveying the exposure completed substrate, and a titler configured to form an identification code on the conveyed substrate. In this case, the titler may form a substrate identification code on one side of each of the substrates transferred by the conveyer and the like.

The conveying line 7 may include at least one conveyer, a stacker configured to temporarily store the transparent conductive metal layer formed substrate and the exposed substrates, and a convey unit (AGV) configured to convey substrates between the corresponding conveyer and the stacker. In this case, the convey unit moves along a moving path determined between at least one conveyer and the stacker to keep a cassette accommodating a plurality of substrates therein in the stacker or to supply a cassette accommodating a plurality of exposed substrates to the conveyer toward the titling line.

The developing line 10 may include a plurality of developing units configured to develop one or more substrates in a manner of transferring the one or more substrates, on which the identification code has been formed by the titling line 9, and spraying a developer on the transferred substrate(s). In particular, each of the plurality of the developing units may include a transfer conveyer configured to transfer the substrate having the identification code thereon to the annealing line 11 and a plurality of spray devices configured to spray the developer on the substrate transferred by the transfer conveyer. Each of the developing units may spray the developer on the substrates transferred in a manner of being aligned in a row via the developing conveyer, and more particularly, in a manner of being consecutively transferred by being aligned in an in-line mode. Therefore, the exposed substrates sequentially transferred via the plurality of the developing units may be developed by the developer sprayed by the plurality of the developing units.

The annealing line 11 is provided to a post-process position of the developing line 10 and performs annealing on the blackened metal patterns completely patterned by the developing process to convert the blacked metal patterns into transparent metal patterns. In this case, the annealing may include a process for hardening the substrate at the temperature of 20 to 150 Celsius degrees using a hard-bake hot plate. As a variation, the temperature used at the annealing process can be 100 to 400 Celsius degrees.

The blackened ITO, IZO and the like is poly-crystallized by the annealing to reduce its specific resistance and to restore its transparency. That is, the annealing of applying heat to the substrate performed in the annealing line 11 restores the blackened metal patterns back to the metal pattern having the original transparency (or close to the original transparency). Preferably, fully transparent metal patterns may be produced, or the metal patterns that are more transparent than the blackened metal patterns may be produced.

A transfer loader unit may be movably provided between at least two of the cleaning line 5, the coating line 6, the blackening line 2, the developing line 10 and the annealing line 11 and may then transfer and load/unload the substrate(s) to/from the process devices/lines, respectively. In this case, the transfer loader unit may include at least one of a robot arm, a conveyer and the like. Preferably, the transfer loader unit may include the robot arm having at least one or more fingers.

FIGS. 2A to 2D are cross-sectional diagrams of a process for forming a transparent metal pattern on a substrate for a flat panel display device according to an embodiment of the present invention. The process of FIGS. 2A to 2D is preferably implemented by using the apparatus of FIG. 1, but can be implemented by using other suitable apparatuses.

Figure 2A:
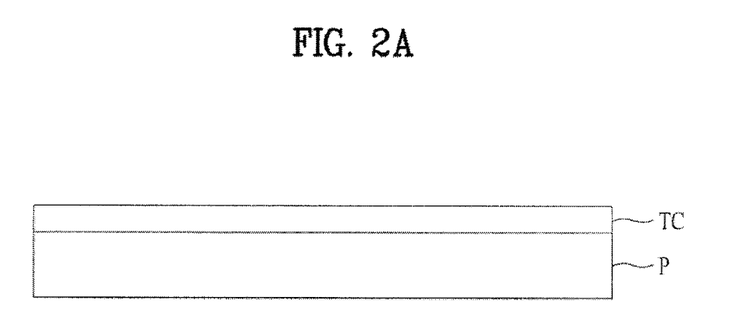
FIGS. 2A to 2D are cross-sectional diagrams of a process for forming a transparent metal pattern on a substrate according to an embodiment of the present invention.

Referring to FIG. 2A, if a cleaned substrate P is delivered to the coating line 6 from the cleaning line 5, the coating line 6 evenly coats the entire surface of the substrate P with a transparent conductive metal layer TC to a preset thickness.

Figure 2B:
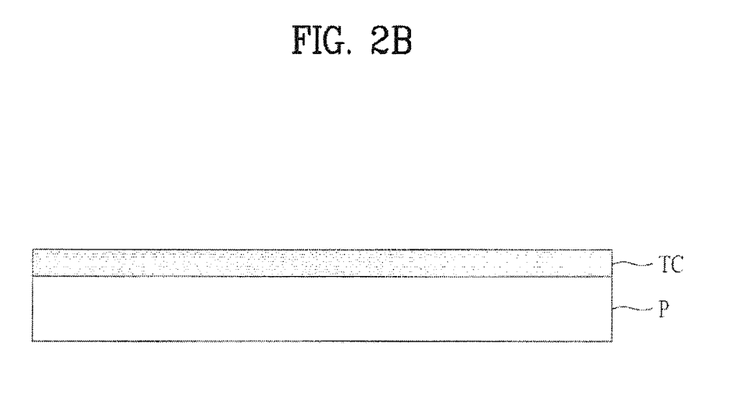

Referring to FIG. 2B, if the blackening line 2 blackens the substrate P, on which the transparent conductive metal layer TC is formed, by plasma CVD, the transparent conductive metal layer TC is blackened as In precipitates according to non-stoichiometry due to oxygen deficiency. The metal layer blackened substrate is then transferred to the exposure line 8, e.g., via the conveying line 7. An exposure process is then performed while a photo mask is aligned on the blackened metal layer at the exposure line 8. The titling line 9 can then place an identification code on the substrate, which may be an optional step. Further, the titling process of the titling line 9 can occur after any other process/line, instead of after the exposure line 8.

Figure 2C:
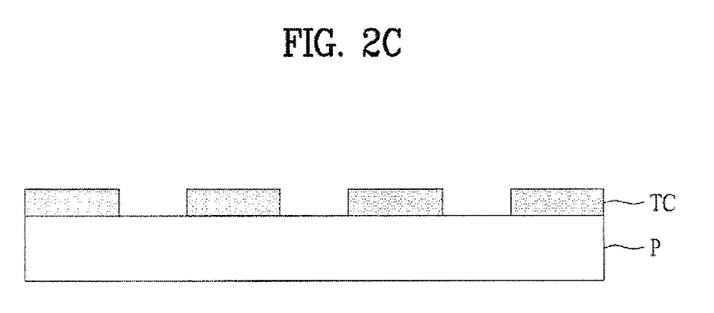

Referring to FIG. 2C, the developing line 10 receives the substrate from the titling line 9 or the exposure line 8. The developing line 10 can perform a development in a manner of spraying a developer on the exposure-completed substrate, and as a result, the blackened metal layer is patterned on the substrate P.

Figure 2D:
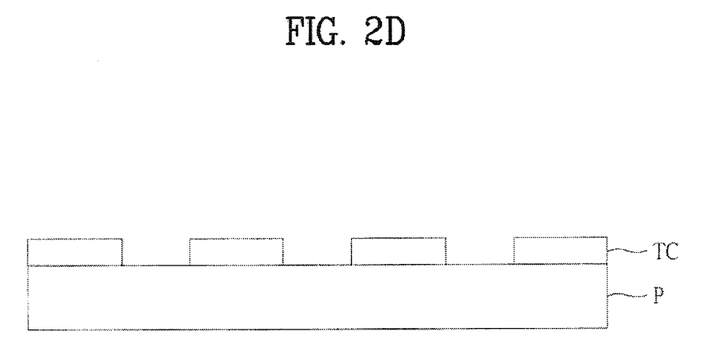

Referring to FIG. 2D, the annealing line 11 receives the substrate P having the blackened metal layer pattern TC thereon. As the annealing line 11 performs annealing to convert the blackened metal patterns into transparent metal patterns, the blackened ITO, the blackened IZO or the like is changed to be transparent again. As a result, the substrate having the transparent metal patterns thereon is formed, which can be used to fabricate display devices.

Figure 3:
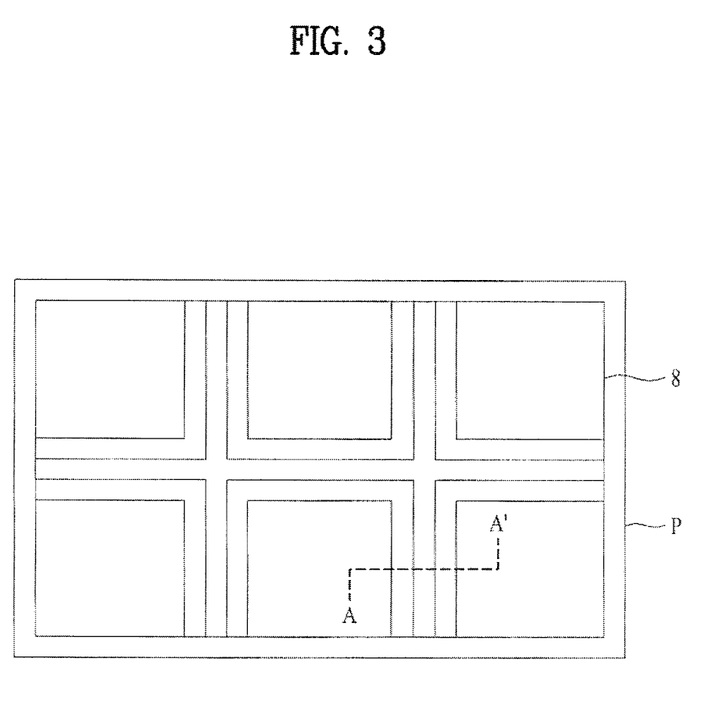
FIG. 3 is a layout of a configuration for aligning a substrate with an exposure line according to an embodiment of the present invention.

FIG. 3 is a layout of a configuration for aligning a substrate in the exposure line 8 according to an example of the present invention. And, FIG. 4 is a cross-sectional diagram along a cutting line A-A' shown in FIG. 3.

Figure 4:
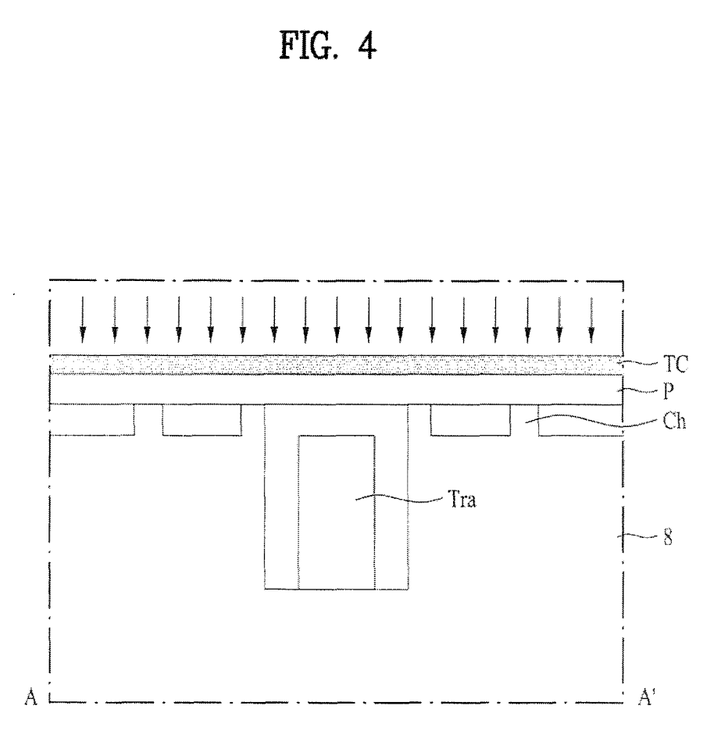
FIG. 4 is a cross-sectional diagram along a cutting line A-A' shown in FIG. 3.

Referring to FIG. 3 and FIG. 4, a tray Tra for transferring a substrate P and a plurality of support chucks and recesses configured to load and fix the substrate P thereto are provided to the exposure unit of the exposure line 8. If the substrate P, on which the blackened metal layer TC is formed according to the present invention, is loaded in the support chuck Ch of the exposure unit, a photo mask (not shown) is aligned on the blackened metal layer TC. If UV rays are applied to the entire surface of the substrate including the photo mask, the UV rays are selectively applied to the blackened metal layer TC through a pattern of the photo mask aligned thereon. As the UV rays pass through the opened area(a) of the photo mask and impinge on the blackened metal layer TC, less UV rays pass through the blacked metal layer TC and thus less UV rays are reflected therefrom. As a result, a more precise patterning of the metal layer TC can occur using the present invention.

As mentioned in the foregoing description, as the light transmissivity of the blackened metal layer TC is lowered, if the light transmissivity is lowered to 40~60% for example, the UV rays applied to the tray Tra or the plurality of support chucks Ch of the exposure unit via the substrate P may be reduced to 40~60% as well. In this case, the reflected UV rays applied by the exposure unit to a backside of the substrate P or the blackened metal layer TC may be reduced to 40~60% as well. Thus less reflected UV rays are applied to the substrate P and/or the metal layer TC, which allows a more precise patterning of the metal layer TC.

Subsequently, as mentioned in the foregoing description, the exposed substrates are patterned by the developing line 10 and the blackened metal patterns are poly-crystallized by the annealing of the annealing line 11 to become transparent again with a reduced resistance.

Figure 5:
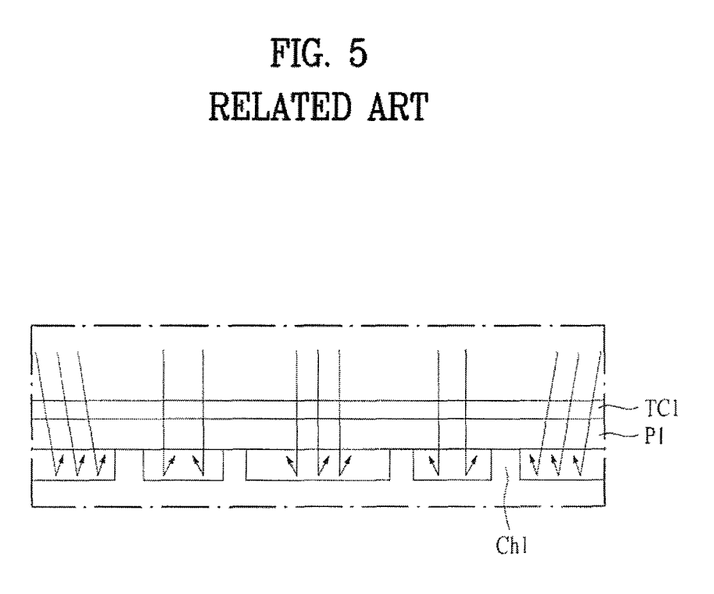
FIG. 5 is a cross-sectional diagram showing an example of a substrate having a non-blackened transparent conductive layer formed on a substrate in an exposure unit according to a related art.

FIG. 5 is a cross-sectional diagram of an example of a substrate having a non-blackened transparent conductive layer (i.e., a transparent conductive layer) formed on a substrate in an exposure unit according to a related art.

Referring to FIG. 5, a transparent substrate P1, of which a transparent conductive metal layer TC1 is not blackened, is loaded in a support chuck Ch1 of an exposure unit. If UV rays are applied to the surface of the substrate P1, they are applied to the transparent conductive metal layer TC1 and the substrate P1, as indicated by the arrows in FIG. 5.

In this case of FIG. 5, since the light transmissivity of the transparent conductive metal layer TC1 is high (since the conductive metal layer TC1 is transparent), the UV rays penetrate through the transparent conductive metal layer TC1 and are reflected by the support chucks Ch1 of the exposure unit. And, the UV rays reflected by the exposure unit are then applied to the backsides of the substrate P1 and the transparent conductive metal layer TC1 again, as indicated by the arrows shown in FIG. 5. In this case, since the reflected directions of the UV rays vary, the UV rays may be applied to the backside of the transparent metal layer TC1. Therefore, in the related art, it becomes difficult to control an exposure quantity and direction for the non-blackened metal layer TC1, and thus to perform a precise fabrication of a transparent pattern or electrode due to the transparency of the (non-blackened) transparent metal layer.

In contrast, in the present invention, if the exposure is performed after blackening the transparent conductive metal layer TC to be patterned, the UV rays applied to the tray Tra or the plurality of support chucks Ch of the exposure unit can be eliminated or reduced. Therefore, the UV rays applied to the backside of the substrate P and/or the blackened metal layer TC by being reflected back by the exposure unit can be eliminated or reduced. Accordingly, the apparatus of the present invention forms a transparent thin film and/or pattern with a more precise thickness and width and lowers a corresponding defective rate, thereby further enhancing the fabrication efficiency. Further, the present invention allows such advantages by using a simple process such as the blackening performed in the blackening line 2.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for fabricating layers of a display device, the apparatus comprising:
    a coating line configured to form a transparent conductive metal layer on a substrate;
    a blackening line configured to receive the transparent conductive metal layer on the substrate from the coating line and blacken the transparent conductive metal layer, wherein the blackening line blacks the metal layer using plasma deposition or a plasma source;
    an exposure line configured to receive the blacked transparent conductive metal layer on the substrate from the blackening line and expose the blackened metal layer;
    a developing line configured to receive the exposed substrate having the blackened metal layer from the exposure line and to perform development on the received substrate to form a blackened metal pattern on the substrate; and
    an annealing line configured to receive the blackened metal pattern on the substrate from the developing line and perform annealing on the blackened metal pattern on the substrate to change the blackened metal pattern into a transparent metal pattern;
    wherein the coating line forms the transparent conductive metal layer on an entire surface of the substrate, and
    wherein the blackening line blackens the transparent conductive metal layer formed on the entire surface of the substrate.

2. The apparatus of claim 1, wherein the blackened metal layer includes indium (In) precipitated due to an interaction with oxygen using the plasma deposition or the plasma source.

3. The apparatus of claim 1, wherein the annealing line performs the annealing including a process of hardening the substrate having the metal layer at a temperature of 100 to 400 Celsius degrees.

4. The apparatus of claim 1, wherein a light transmissivity of the blackened metal layer is 40~60% lower than a light transmissivity of the transparent conductive metal layer.

5. The apparatus of claim 1, wherein the transparent conductive metal layer is formed of ITO (indium tin oxide) or IZO (indium zinc oxide).

6. The apparatus of claim 1, further comprising:
    at least one loading/unloading unit configured to load the substrate toward the coating line and to unload the substrate from the annealing line.

7. The apparatus of claim 1, further comprising:
    a titling line configured to place an identification information on the substrate.

8. An apparatus for forming a layer pattern of a display device, the apparatus comprising:
    a first line configured to form a transparent conductive metal layer on a substrate;
    a second line configured to receive the transparent conductive metal layer on the substrate from the first line and temporarily change a transparency of the metal layer by changing the transparent conductive metal layer into a less-transparent conductive metal layer, wherein the second line blackens the metal layer using plasma deposition or a plasma source;
    a third line configured to receive the less-transparent conductive metal layer on the substrate from the second line and perform exposure and development on the substrate having the less-transparent conductive metal layer to pattern the less-transparent conductive metal layer; and
    a fourth line configured to receive the patterned less-transparent conductive metal layer on the substrate and perform annealing on the patterned less-transparent conductive metal layer to change the less-transparent conductive metal layer back to the transparent conductive metal layer;
    wherein the first line forms the transparent conductive metal layer on an entire surface of the substrate, and
    wherein the second line blackens the transparent conductive metal layer formed on the entire surface of the substrate.

9. The apparatus of claim 8, wherein the second line temporarily changes the transparency of the metal layer using a plasma deposition or a plasma source.

10. The apparatus of claim 9, wherein the less-transparent conductive metal layer includes indium (In) precipitated due to an interaction with oxygen using the plasma deposition or the plasma source.

11. The apparatus of claim 8, wherein the fourth line performs the annealing including a process of hardening the substrate having the metal layer at a temperature of 100 to 400 Celsius degrees.

12. The apparatus of claim 8, wherein a light transmissivity of the less-transparent conductive metal layer is 40-60% lower than a light transmissivity of the transparent conductive metal layer.

13. The apparatus of claim 8, wherein the transparent conductive metal layer is formed of ITO (indium tin oxide) or IZO (indium zinc oxide).

14. The apparatus of claim 8, further comprising:
a fifth line configured to place an identification information on the substrate.

\* \* \* \* \*